United States Patent
Lee et al.

(10) Patent No.: US 6,944,051 B1
(45) Date of Patent: Sep. 13, 2005

(54) DATA RESTORE IN THRYISTOR BASED MEMORY DEVICES

(75) Inventors: Zachary K. Lee, Cupertino, CA (US); Farid Nemati, Menlo Park, CA (US); Scott Robins, San Jose, CA (US)

(73) Assignee: T-Ram, Inc., San Jose, CA (US)

( * ) Notice: Subject to any disclaimer, the term of this patent is extended or adjusted under 35 U.S.C. 154(b) by 127 days.

(21) Appl. No.: 10/695,171

(22) Filed: Oct. 29, 2003

(51) Int. Cl.[7] .............................................. G11C 11/00
(52) U.S. Cl. ........................ 365/159; 365/175; 365/187
(58) Field of Search ................................ 365/159, 174, 365/175, 187, 189.09

(56) References Cited

U.S. PATENT DOCUMENTS

| | | | |
|---|---|---|---|
| 3,918,033 A | * 11/1975 | Case et al. .................. 365/180 |
| 4,031,412 A | 6/1977 | Ohhinata et al. | |
| 4,829,357 A | 5/1989 | Kasahara | |
| 4,864,168 A | 9/1989 | Kasahara et al. | |
| 5,099,300 A | 3/1992 | Baliga | |
| 5,535,156 A | * 7/1996 | Levy et al. .................. 365/175 |
| 6,229,161 B1 | 5/2001 | Nemati et al. | |
| 6,462,359 B1 | 10/2002 | Nemati et al. | |

FOREIGN PATENT DOCUMENTS

| WO | WO 02/082453 A1 | 10/2002 |
|---|---|---|
| WO | WO 02/082504 A2 | 10/2002 |
| WO | WO 02/082504 A3 | 10/2002 |

* cited by examiner

Primary Examiner—Van Thu Nguyen

(57) ABSTRACT

In a thyristor based memory cell, one end of a reversed-biased diode is connected to the cathode of the thyristor. During standby, the second end of the diode is biased at a voltage that is higher than that at the cathode of the thyristor. During restore operation, the second end is pulled down to zero or even a negative value. If the cell is storing a "1," the voltage at the thyristor cathode can be approximately 0.6 volt at the time of the pull down. The large forward-bias across the diode pulls down the thryistor cathode. This causes the thyristor to be restored. If the cell is storing a "0," the voltage at the thyristor cathode can be approximately zero volt. The small or zero forward-bias across the diode is unable to disturb the "0" state. As a result, the memory cell is restored to its original state.

19 Claims, 5 Drawing Sheets

DATA RESTORE IN THRYISTOR BASED MEMORY DEVICES

FIELD OF THE INVENTION

This disclosure relates to memory devices, and more specifically, to an arrangement for restoring the state of memory devices.

BACKGROUND

Recent technological advances in the semiconductor industry permitted dramatic increases in integrated circuit density and complexity. These improvements have led to a dramatic increase in their use in a variety of applications, especially digital applications. An important part in the design, construction, and manufacture of semiconductor devices concerns semiconductor memory and other circuitry used to store information. Conventional random access memory devices include a variety of circuits, such as SRAM and DRAM circuits. The construction and formation of such memory circuitry typically involves forming at least one storage element and circuitry designed to access the stored information. DRAM is very common due to its high density (which results in a low price), with DRAM cell size being typically between 6 $F^2$ and 8 $F^2$ (where F is the minimum feature size). However, with typical DRAM access times of approximately 50 nsec, DRAM is relatively slow compared to typical microprocessor speeds and requires refresh. SRAM is another common semiconductor memory that is much faster than DRAM and, in some instances, is of an order of magnitude faster than DRAM. Also, unlike DRAM, SRAM does not require refresh. SRAM cells are typically constructed using 4 transistors and 2 resistors or 6 transistors, which result in much lower density, with typical cell size being between about 60 $F^2$ and 150 $F^2$.

Recently, a new type of memory cells has been developed. These cells consist of a NDR (Negative Differential Resistance) device having a control port that is capacitively coupled to a relatively thin thyristor body. The thyristor body is sufficiently thin to permit modulation of the potential of the thyristor body in response to selected signals capacitively coupled via the control port. Such capacitively-coupled signals are used to enhance switching of the thyristor-based device between current-blocking and current-conducting states. One advantage of this type of cells is that the cell size is much smaller than the four-transistor and six-transistor SRAM cells.

An important consideration in the design of thyristor-based memory cells, including the above described thyristor-based type, concerns maintenance of the thyristor's conducting state. When the thyristor is in the forward conducting state, a DC current larger than the holding current of the thyristor flows through the thyristor in order to maintain the conducting state. One method to maintain the conducting state is to use a restoration circuit to periodically apply a voltage or current pulse to the thyristor so that data in the cell is restored using the internal positive feedback loop of the thyristor. The pulse waveform and frequency are defined to ensure that the transistor is not released from its conducting state. This restoration is typically applied after the thyristor device is fully in the forward conducting state and in a manner that prevents the thyristor device from transitioning completely out of the forward conducting state. This method is described in a patent document WO 02/082451 A1 published Oct. 17, 2002 and entitled "Dynamic Data Restore in Thyristor-Based Memory Device."

SUMMARY

The present invention involves a new memory state restoration arrangement for a thyristor based memory cell. One end of a reversed-biased diode is connected to the cathode of the thyristor. During standby, the second end of the diode is biased at a voltage that is higher than that at the cathode of the thyristor. During restore operation, the second end is pulled down to zero or even a negative value. If the cell is storing a "1," the voltage at the thyristor cathode can be approximately 0.6 volt at the time of the pull down. The large forward-bias across the diode pulls down the thryistor cathode. This causes the thyristor to be restored. If the cell is storing a "0," the voltage at the thyristor cathode can be approximately zero volt. The small or zero forward-bias across the diode is unable to disturb the "0" state. As a result, the memory cell is restored to its original state.

The above summary of the present invention is not intended to describe every implementation of the present invention. The figures and detailed description that follow more particularly exemplify these implementations.

DETAILED DESCRIPTION

The present invention is believed to be applicable to different types of memory devices, and has been found to be particularly useful for devices using high-speed, low-power, thyristor-based memory cells. While the present invention is not necessarily limited to such devices, various aspects of the invention may be appreciated through a discussion of various examples using this context.

Figure 1:
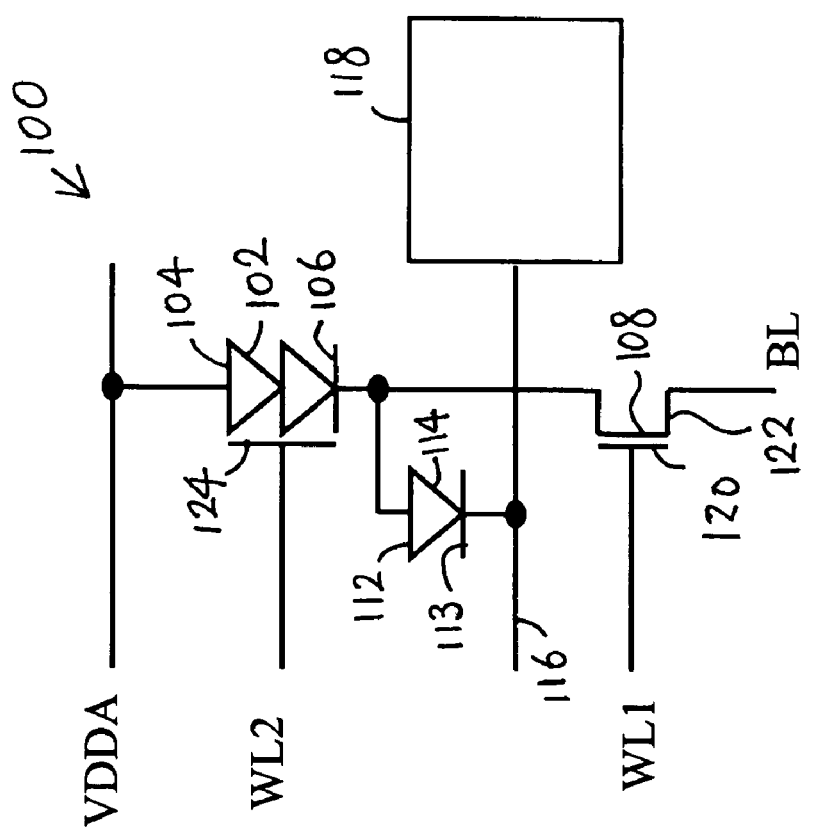
FIG. 1 is a schematic diagram showing one embodiment of a memory cell of the present invention.

FIG. 1 is a schematic diagram showing one embodiment of a memory cell 100 of the present invention. It comprises a thyristor 102 having an anode 104 connected to a voltage source and a cathode 106 connected to an access transistor 108. Cathode 106 of thyristor 102 is also connected to an anode 112 of a diode 114. The cathode 113 of diode 114 is connected to a diode line 116, which is connected to a voltage controller 118 that can generate predetermined voltage waveforms.

The voltage level of cathode 106 of diode 102 depends on whether a "1" or a "0" is stored in memory cell 100. During standby of an exemplary thryistor, the voltage level of cathode 106 is about 0.6V or higher if a "1" is stored and about 0 volt if a "0" is stored. If voltage controller 118 is at approximately 1.2 volt during standby, diode 114 is always reverse-biased with respect to cathode 106. As a result, the data of memory cell 100 is not disturbed.

During a restore operation, voltage controller 118 pulls line 116 to approximately 0 volt (or even a negative voltage such as −0.5V). If memory cell 100 is storing a "1" (for example, cathode 106 is at about 0.6 volt), the forward-bias between cathode 106 and line 116 results in a rather large voltage drop (~0.6V) across one of the base-emitters of the thyristor, which starts the regenerative positive feedback effect in thyristor 102 and flows current into line 116. The "1" state is restored. Additional information about the regenerative positive feedback can be found in the above described patent document WO 02/082451 A1. If the thyristor is holding a "0", i.e., cathode 106 is at about 0 volt, pulling line 116 to approximately 0 volt would not affect the "0" state of memory cell 100.

Figure 2:
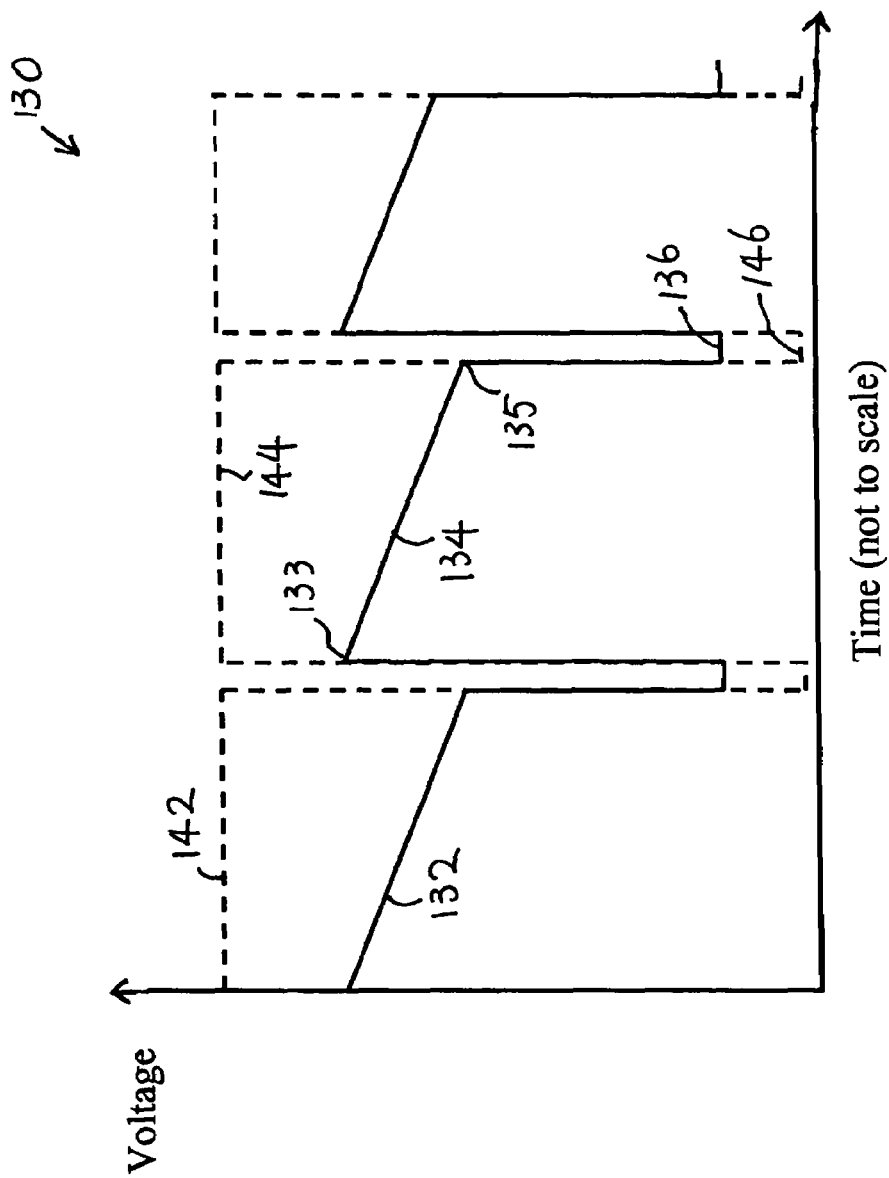
FIG. 2 is a timing diagram showing a restore operation for a memory cell having a "1" state.
Figure 3:
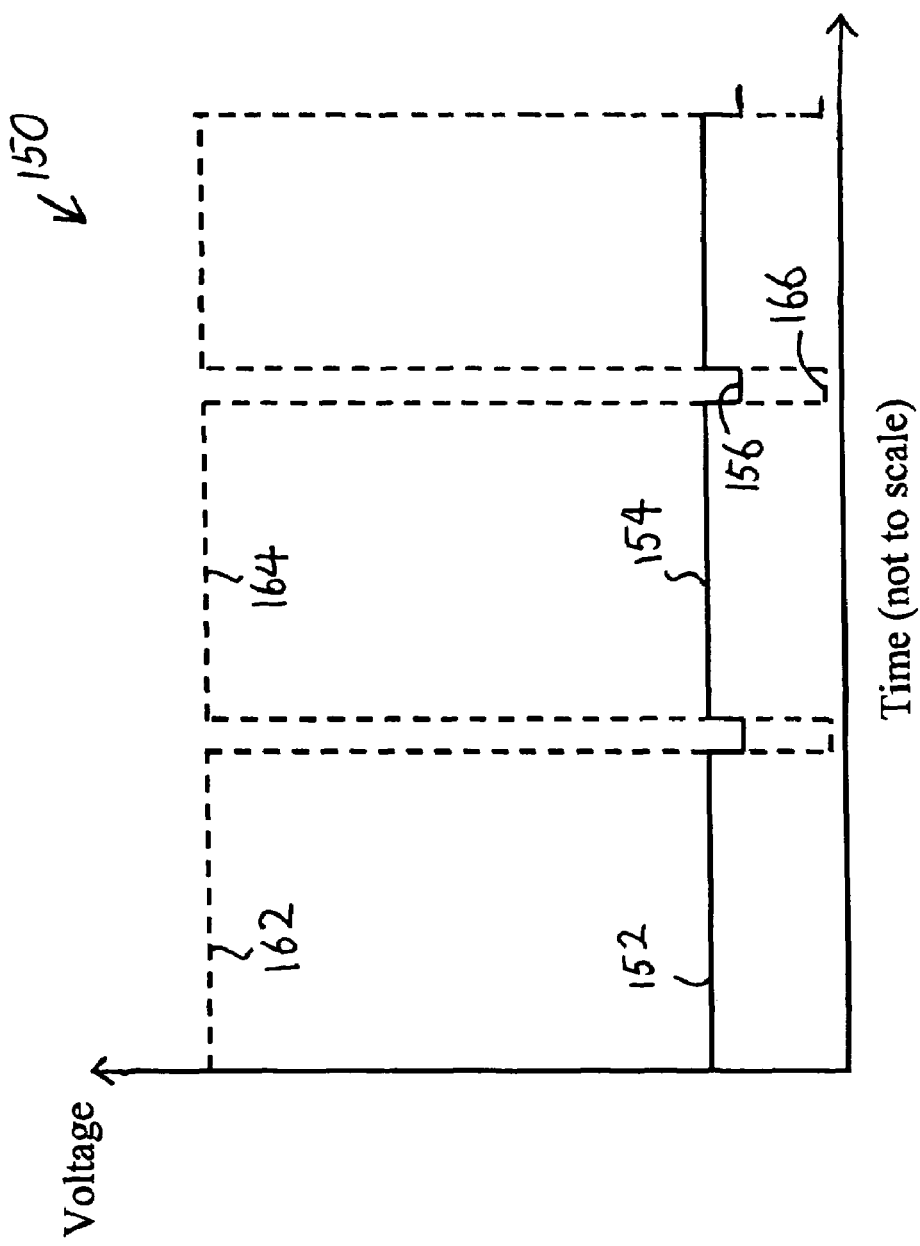
FIG. 3 is a timing diagram showing a restore operation for a memory cell having a "0" state.

The above described restore operation can be more clearly understood by referring to a timing diagram 130 of FIG. 2 (for a "1" state) and a time diagram 150 of FIG. 3 (for a "0" state). In timing diagram 130, the voltage of cathode 106 is shown as a curve 132 while the voltage of diode line 116 is shown as a curve 142. During standby, the voltage at cathode 106 decreases over time from a starting voltage value 133 to an ending voltage value 135, as shown in line segment 134. In an exemplary thyristor based memory cell, the voltage value 133 is approximately 1.1 volt and the voltage value 135 is approximately 0.6 volt. During that time, the voltage of diode line 116 is held at around 1.2 volt (i.e., at a higher value than that of value 133), as shown in line segment 144. When it is time for restore operation, the voltage level of diode line 116 is pulled down to near zero, as shown in line segment 146. The voltage level of cathode 106 follows suit, and also drops to a low level, as shown in line segment 136, at, for example, approximately 0.2V. At this time, thyristor 102 goes through a regenerative positive feedback. When the voltage of diode line 116 is pulled up to its original level, the voltage of cathode 106 returns to a level that is substantially the same as starting value 133. The voltage of cathode 106 then decreases slowly. This cycle repeats continuously. The duration of a cycle can have a wide range, such as between 1 us and 10 ms, with typical value on the order of 20 us. The restore operation can be as short as 0.1 ns, with typical value on the order of 0.5 ns.

In this implementation, the internal positive feedback loop in the thyristor is used to restore its conducting state. The waveform and frequency of voltage controller 118 are selected to ensure that the thyristor is not released from its conducting state. This restoration is typically applied after the thyristor is fully in the forward conducting state and in a manner that prevents the thyristor from transitioning completely out of the forward conducting state.

In timing diagram 150 (i.e., the state is "0"), the voltage of cathode 106 is shown as a curve 152 while the voltage of diode line 116 is shown as a curve 162. During standby, the voltage at cathode 106 remains roughly constant (e.g., 0V), as shown in line segment 154. As discussed above in connection with FIG. 2, the voltage of diode line 116 is held at around 1.2 volt, as shown in line segment 164. During the time for restore operation of FIG. 2, the voltage level of diode line 116 drops to near zero (or even a negative value such as −0.5V), as shown in line segment 166. The voltage level of cathode 106 becomes only slightly perturbed, and may drop to only −0.1V or higher. The difference in voltage level of line segments 156 and 166 is unable to affect the state of memory cell 100 (i.e., not enough base-emitter voltage to start the regenerative process). As a result, the state of the memory cell remains unchanged. When the voltage of diode line 116 is pulled up to its original level, the voltage of cathode 106 returns to a level that is substantially the same as that of line segment 154. This cycle repeats continuously.

Circuits that can periodically generate the above-described voltage levels for diode line 116 can be easily designed by a circuit engineer. Thus, no exemplary circuit is shown here.

Returning now to FIG. 1, access transistor 108 in memory cell 100 has a gate 120 typically connected to a first word line (WL1) and one of its source/drains 122 typically connected to a bit line (BL). Thyristor 102 also has a control gate 124 that is typically connected to a second word line (WL2) while its anode 104 is typically connected to a voltage line (VDDA). One type of thyristor that is suitable for use in memory cell 100 is a thin capacitively coupled thyristor described in U.S. Pat. No. 6,229,161, the disclosure of which is incorporated herein by reference.

Figure 4:
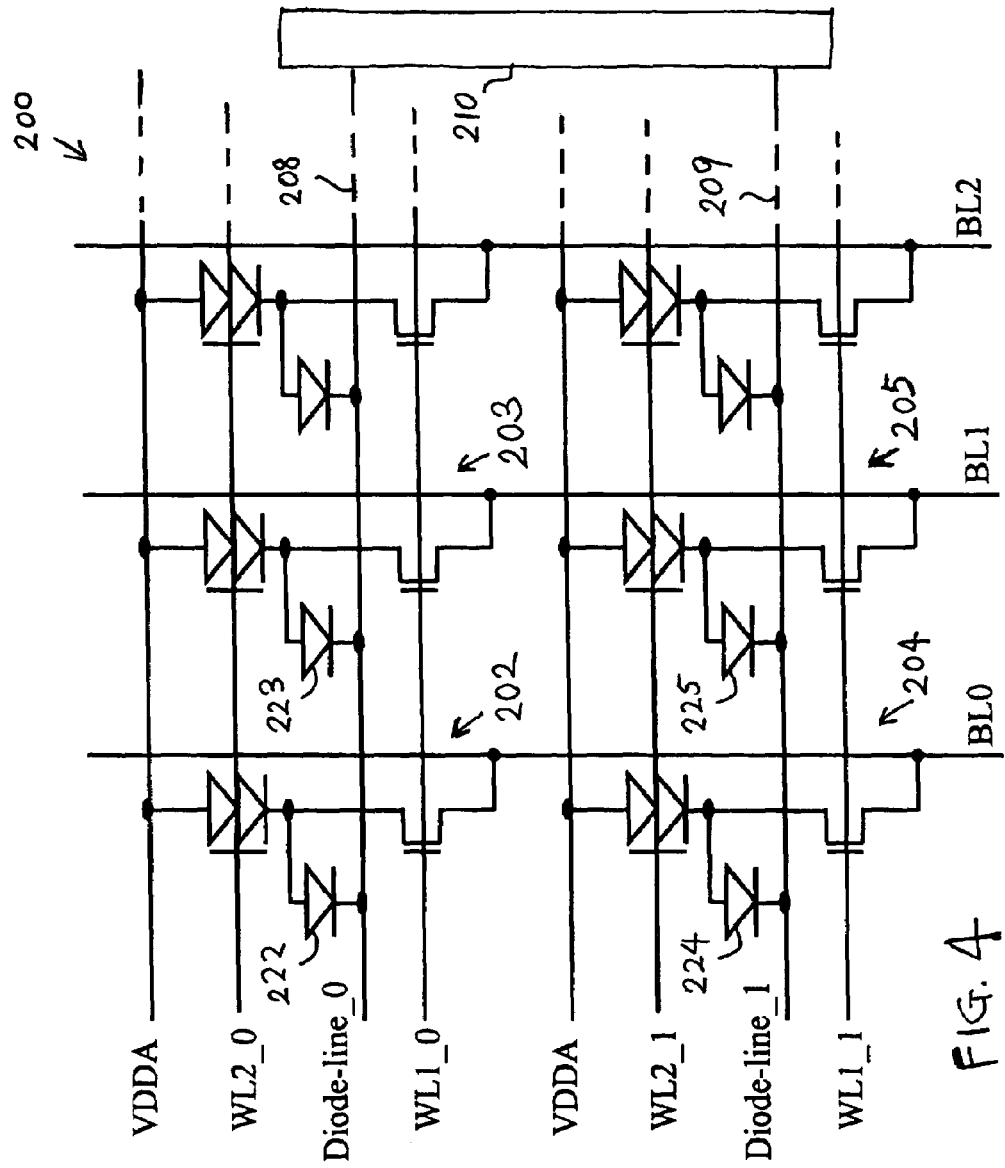
FIG. 4 is a schematic diagram showing a portion of an exemplary memory array of the present invention.

The memory cells of the present invention can be used in various memory arrays. FIG. 4 is a schematic diagram showing a portion of an exemplary memory array 200 of the present invention. It comprises a plurality of memory cells, such as cells 202–205. The first word line (WL1_0), second word line (WL2_0), and VDDA lines are connected to the access transistor gate, thyristor control gate, and thyristor anode, respectively, of memory cells 202–203 (and other cells in the same row). In the exemplary memory array, these lines are substantially parallel. The cathodes of the diodes 222–223 used for restoration of memory cells 202–203 are connected to a diode line 208, and this line is substantially parallel to at least one of the WL1_0 and WL2_0 lines.

Other rows of memory cells are connected in a similar way. Thus, a diode line 209 connects the cathodes of diodes 224–225 of memory cells 204–205 (and other cells in the same row). This diode line is substantially parallel to at least one of the WL1_1 and WL2_2 lines for this row.

In one embodiment, diode lines 208, 209 (and other diode lines for other rows) are connected to a voltage controller 210 that generates the necessary waveform for restoration operations. Alternatively, each diode line (or a set of diode lines) can be connected to a dedicated voltage controller.

Figure 5:
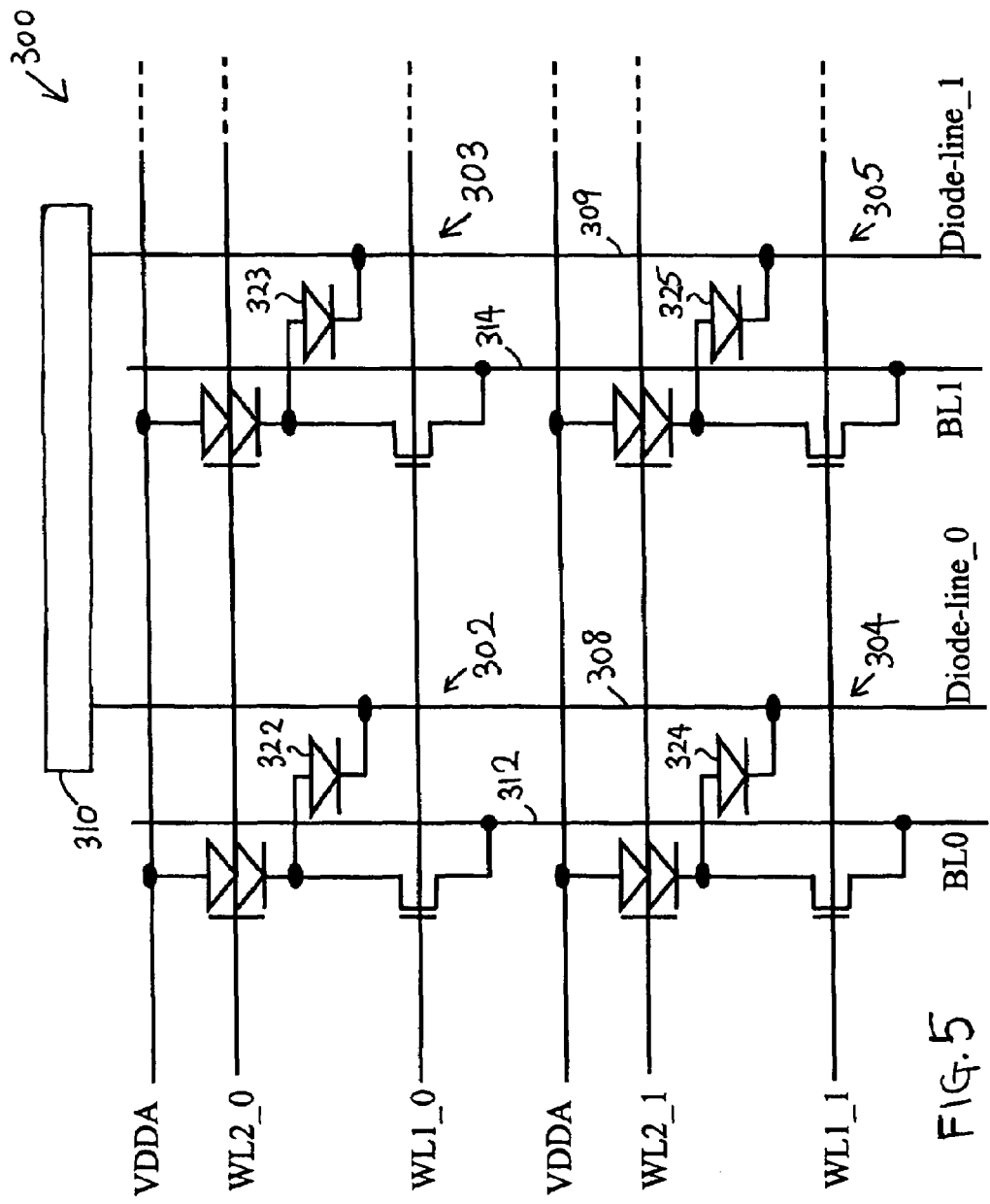
FIG. 5 is a schematic diagram showing a portion of another exemplary memory array of the present invention.

FIG. 5 is a schematic diagram showing a portion of another exemplary memory array 300 of the present invention. It comprises a plurality of memory cells, such as cells 302–305. Cells 302–305 are substantially the same as cells 202–205 of FIG. 4. Each cell has a diode (such as diodes 322–325) used for restore operation. However, diode lines 308 and 309 are parallel to at least one of the bit lines 312 and 314 (instead of the word lines, as in FIG. 4). Diode lines 308 and 309 are connected to a voltage controller 310 (or individual dedicated controllers).

This invention has been described in order to provide those skilled in the memory art with the information needed to apply the novel principles of the present invention. While particular embodiments of the present invention have been described herein in detail, it is to be understood that various alterations, modifications and substitutions can be made therein without departing in any way from the spirit and scope of the present invention, as defined in the claims which follow.

What is claimed is:

1. A memory cell comprising:
   a thyristor having a cathode and an anode;
   an access transistor having one of its source/drain region connected to the cathode of the thyristor; and
   a diode having an anode and a cathode, the anode of the diode being connected to the cathode of the thyristor, the cathode of the diode accepting a voltage having a first level at a first time period and a second level at a second time period, with the first level being higher than the second level.

2. The memory cell of claim 1 wherein the second level is equal to approximately zero volt.

3. The memory cell of claim 1 wherein the second level has a negative value.

4. The memory cell of claim 1 wherein the first time period has a duration that is longer than that of the second time period.

5. The memory cell of claim 1 wherein the thyristor comprises a control gate for controlling a conductive state of the thyristor.

6. The memory cell of claim 1 wherein the thyristor performs an internal positive feedback operation during the second time period while in a "1" state.

7. The memory cell of claim 1 wherein the thyristor is a thin capacitively coupled thyristor.

8. A memory array comprising:
- at least two sets of memory cells, each set comprising at least a word line, a diode line and at least one memory cell comprising:
  - a thyristor having a control port and a cathode, the control port being connected to the word line; and
  - a diode having an anode and a cathode, the anode of the diode being connected to the cathode of the thyristor and the cathode of the diode being connected to the diode line;
- the word line and the diode line of the at least two sets being substantially parallel to each other; and
- a voltage controller connected to the diode line of at least one of the at least two sets, the voltage controller generating a first level at a first time period and a second level at a second time period, with the first level being higher than the second level.

9. The memory cell of claim 8 wherein the second level is equal to approximately zero volt.

10. The memory cell of claim 8 wherein the second level has a negative value.

11. The memory cell of claim 8 wherein the first time period has a duration that is longer than that of the second time period.

12. The memory cell of claim 8 wherein the thyristor performs an internal positive feedback operation during the second time period while in a "1" state.

13. The memory cell of claim 8 wherein the thyristor is a thin capacitively coupled thyristor.

14. A memory array comprising:
- at least two set of memory cells, each set comprising at least a bitline, a diode line and at least one memory cell comprising:
  - a thyristor having a cathode;
  - an access transistor having one end connected to the cathode of the thyristor and another end connected to the bit line; and
  - a diode having an anode and a cathode, the anode of the diode being connected to the cathode of the thyristor and the cathode of the diode being connected to the diode line;
- the bit line and the diode line of the at least two sets being substantially parallel to each other; and
- a voltage controller connected to the diode line of at least one of the at least two sets, the voltage controller generating a first level at a first time period and a second level at a second time period, with the first level being higher than the second level.

15. The memory cell of claim 14 wherein the second level is equal to approximately zero volt.

16. The memory cell of claim 14 wherein the second level has a negative value.

17. The memory cell of claim 14 wherein the first time period has a duration that is longer than that of the second time period.

18. The memory cell of claim 14 wherein the thyristor performs an internal positive feedback operation during the second time period while in a "1" state.

19. The memory cell of claim 14 wherein the thyristor is a thin capacitively coupled thyristor.

\* \* \* \* \*